United States Patent [19]
Shacham

[11] Patent Number: 6,033,960
[45] Date of Patent: Mar. 7, 2000

[54] METHOD TO IMPROVE THE BREAKDOWN VOLTAGE OF P-CHANNEL DEVICES

[75] Inventor: Etan Shacham, Cupertino, Calif.

[73] Assignee: National Semiconductor Corporation

[21] Appl. No.: 09/006,600

[22] Filed: Jan. 13, 1998

[51] Int. Cl.[7] .................................................. H01L 21/336
[52] U.S. Cl. ........................... 438/294; 438/297; 438/298
[58] Field of Search .................................... 438/294, 297, 438/298

[56] References Cited

U.S. PATENT DOCUMENTS

| | | | |
|---|---|---|---|
| 4,011,105 | 3/1977 | Paivinen et al. | 148/1.5 |
| 4,847,213 | 7/1989 | Pfiester | 438/440 |
| 5,360,749 | 11/1994 | Anjum et al. | 438/291 |
| 5,395,773 | 3/1995 | Ravindhran et al. | 437/27 |
| 5,397,727 | 3/1995 | Lee et al. | 438/257 |
| 5,486,487 | 1/1996 | Ginami et al. | 437/45 |

*Primary Examiner*—John F. Niebling
*Assistant Examiner*—John Murphy
*Attorney, Agent, or Firm*—Limbach & Limbach L.L.P.

[57] ABSTRACT

A P-channel MOS device having an elevated breakdown voltage is created without increasing device size or requiring additional fabrication steps. During the P-field implant step, P type dopant is implanted into regions of the silicon expected to lie along the silicon-silicon dioxide interface after silicon dioxide growth. P type dopant implanted in this manner counteracts the effect of phosphorous accumulation at the silicon-silicon dioxide interface due to segregation of N type dopant during subsequent silicon dioxide growth steps

4 Claims, 4 Drawing Sheets

FIG. 5A
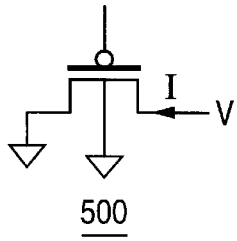
500
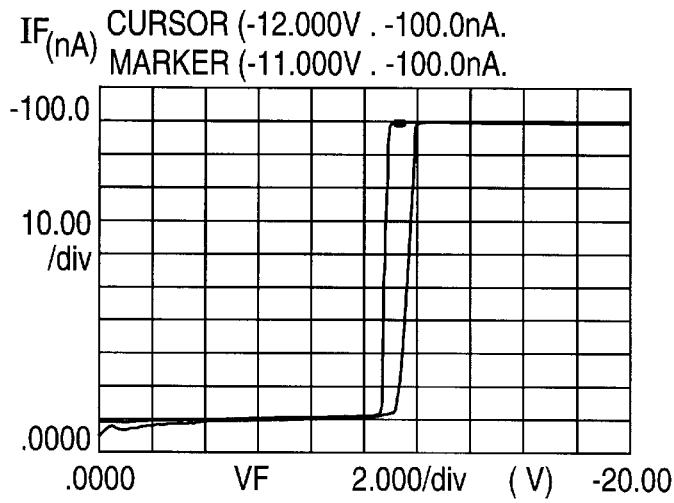
FIG. 5B
FIG. 5C
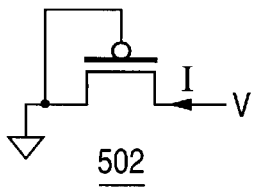
502
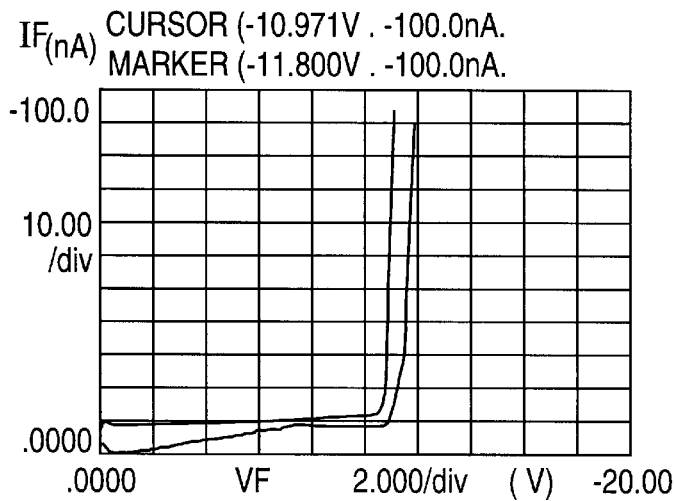
FIG. 5D
FIG. 5E
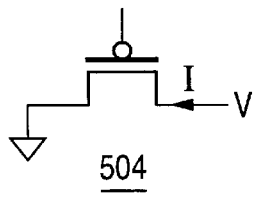
504
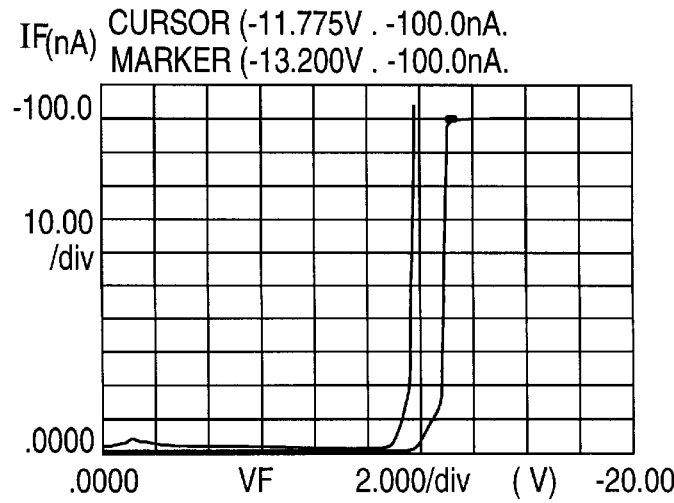
FIG. 5F

METHOD TO IMPROVE THE BREAKDOWN VOLTAGE OF P-CHANNEL DEVICES

BACKGROUND OF THE INVENTION

1. Field of the Invention.

The present invention relates to a method of fabricating a P-channel device having a higher breakdown voltage without increasing device size or requiring additional fabrication steps, and, more particularly, to implanting P type dopant during the P-field implant step into regions of the silicon expected to lie at the silicon-silicon dioxide interface, thereby compensating for later accumulation of N type dopant at the silicon-silicon dioxide interface due to segregation.

2. Description of the Related Art.

P-channel devices are used extensively in row decoders of non-volatile memory devices having ever-shrinking geometries. Because of the corresponding increase in substrate dopant concentration required to accommodate the shrink in lateral distances in these devices, P-channel devices are not able to withstand the voltage requirements of these row decoders.

FIG. 1 shows two current paths through P-channel device 100. Proper, desired current flow indicated by solid line 102, is from source contact 104 to source 106, through channel 108 to drain 110 and out through drain contact 112. Unwanted drain-substrate (DSS) breakdown current flow indicated by dashed line 114, is from source contact 104, to source 106, through channel 108 to drain 110, and then directly into substrate 116 and out substrate contact 118.

One of the primary reasons for reduced breakdown voltages in modern P-channel devices is the higher concentration of P type dopant at key regions of the device. Referring again to FIG. 1, field oxide 120 electrically isolates drain 110 from other electrically-active regions of the P-channel device. However, high concentrations of N dopant that accumulate at silicon-silicon dioxide interface 122 can facilitate current flow from drain 110 into substrate 116. This relationship between elevated dopant concentration and current flow is known as "avalanche breakdown", and has been described at length in Physics and Technology of Semiconductor Devices, Andy S. Grove, John Wiley and Sons, Inc., New York, 1967.

Unfortunately, accumulation of N type dopant at the silicon-silicon dioxide interface is inevitable during the growth of silicon dioxide because of the natural process of segregation. FIG. 2 illustrates the process of segregation. FIG. 2A shows a layer of N doped silicon 200 having a surface 201 at height 202. As shown in FIG. 2B, upon exposure of surface 201 of silicon 200 to oxidizing conditions, surface 201 reacts with oxygen to create silicon dioxide 203. Formation of silicon dioxide 203 out of silicon 200 and oxygen causes the surface to swell from the original height 202. N type impurities originally present in silicon 200 are excluded from silicon dioxide 203, and are "segregated" and accumulate in the silicon 200 along the silicon-silicon dioxide interface 204.

SUMMARY OF THE INVENTION

The present invention provides a method for fabricating P-channel devices having higher breakdown voltages. P type dopant is implanted into regions of the N-well expected to lie at the silicon-silicon dioxide interface when oxides are grown. As a result, these implanted regions are effectively depleted in N type dopant. Later segregation of N type impurity into the implanted regions during silicon dioxide growth simply replenishes the effective N-type dopant concentration in the implanted regions to less than original levels.

BRIEF DESCRIPTION OF THE DRAWINGS

FIGS. 5A–5F show the increase in $BV_{DSS}$ of several P-channel devices fabricated in accordance with one embodiment of the present invention.

DETAILED DESCRIPTION

Conventional processes for forming P-channel devices normally utilize a selective implant of P type dopant prior to the growth of silicon dioxide. This implant step is generally referred to as the "P-field implant." All areas of the N type silicon in which the P-channel device is formed are excluded from the conventional P-field implant.

The current invention alters the extent of the P-field implant in order to allow implantation of P type dopant in N well areas expected to lie at the silicon-silicon dioxide interface. This is done by redrawing the mask defining the P-field implant to expose precursor silicon-silicon dioxide interface areas.

Figure 1:
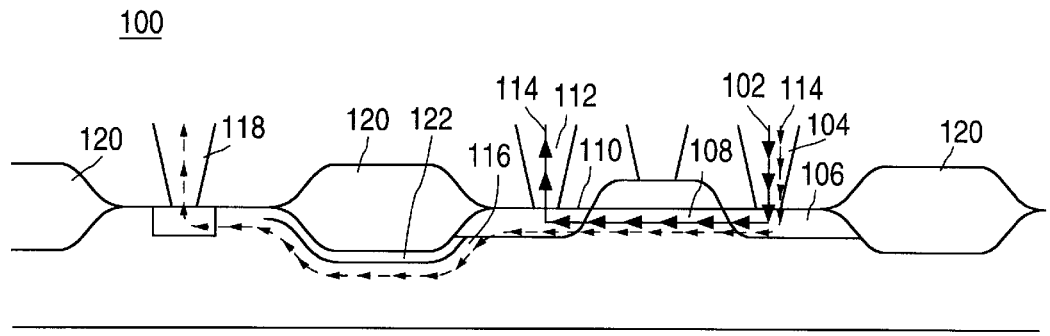
FIG. 1 shows a cross-sectional view of a conventional P-channel device.
Figure 2A:
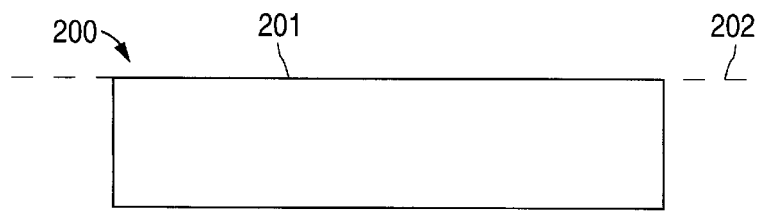
FIGS. 2A–2B show the effect of segregation upon N type dopant concentration levels in N type silicon.
Figure 2B:
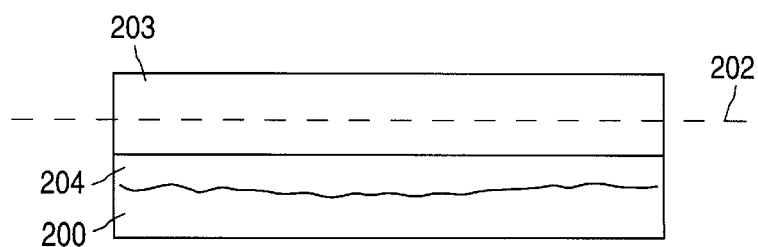
Figure 3A:
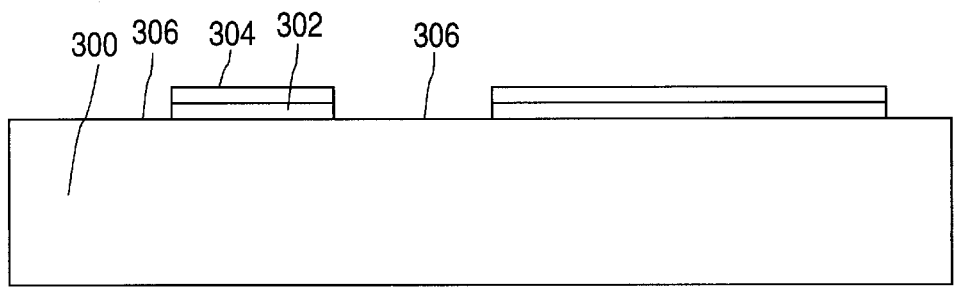
FIGS. 3A–3D illustrate steps leading to formation of a P-channel device in accordance with one embodiment of the present invention.

FIGS. 3A–3D illustrate steps leading to formation of a P-channel device in accordance with one embodiment of the present invention. FIG. 3A shows an N type substrate 300 having pad oxide 302 and nitride 304 deposited to define silicon dioxide growth regions 306.

Figure 3B:
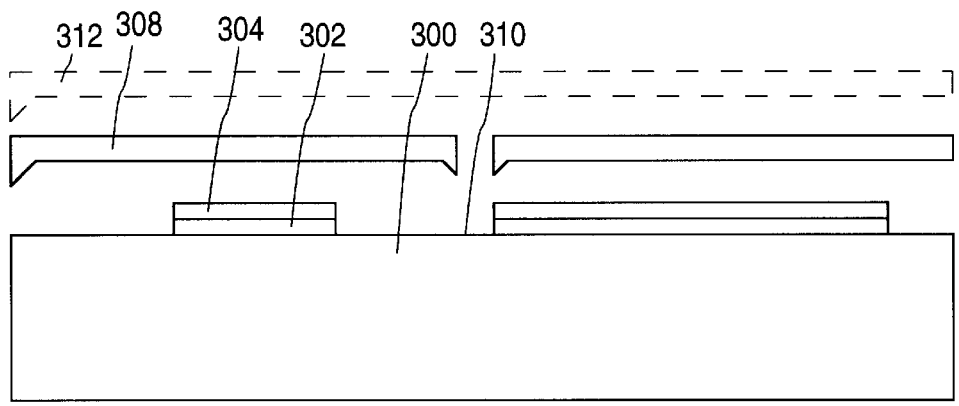

FIG. 3B shows the P-field masking step in accordance with the present invention. P-field mask 308 blocks all but a narrow portion 310 of the surface of the N type silicon. By contrast, conventional P-field mask 312 would normally block the entire surface. Narrow portion 310 corresponds to the expected location of the silicon-silicon dioxide interface adjacent to the drain.

Figure 3C:
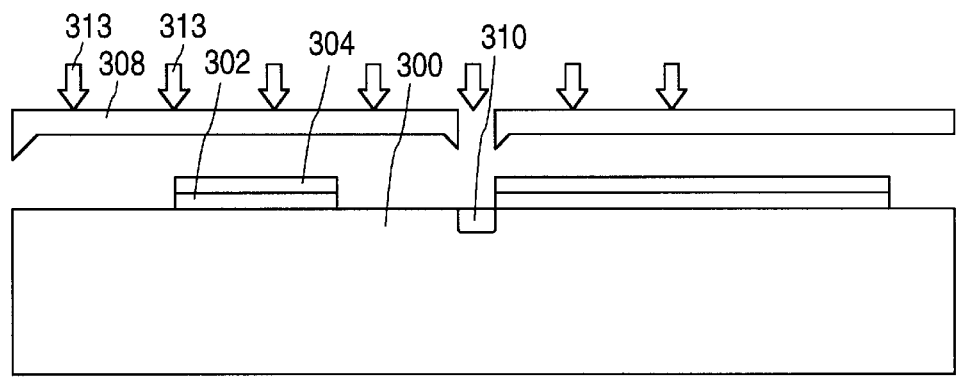

FIG. 3C shows the implant of P type dopant 313 into unmasked narrow portion 310. The effect of implanting narrow region 310 with P type dopant is to deplete narrow region 310 in N type dopant.

Figure 3D:
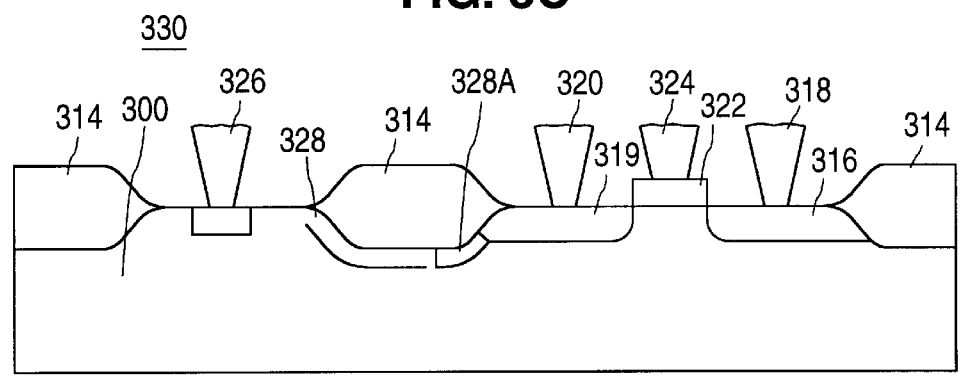

FIG. 3D shows subsequent growth of silicon dioxide 314 followed by formation of source 316 and source contact 318, drain 319 and drain contact 320, gate 322 and gate contact 324, and substrate contact 326. Because narrow portion 310 now corresponds to portion 328a of the silicon-silicon dioxide interface region 328 immediately adjacent to drain 319, accumulation of N type dopant in portion 328a merely replenishes N type impurity concentration to near-original levels. This prevents an increase of N type dopant that could cause unwanted avalanche breakdown and a flow of current from drain 319, through portion 328a and the rest of the silicon-silicon dioxide interface 328, to substrate contact 326.

The completed P-channel device 330 formed from the process of the present invention has a higher breakdown voltage than the conventional device. Device 330 is purposefully formed so that the concentration of N type dopant at portion 328a is insufficient to create a conductive path between the drain and the substrate contact. The effect of segregation of the N type dopant is thus anticipated and counteracted by the P-field implant in accordance with the present invention, thereby increasing the breakdown voltage of the P-channel device 330.

Figure 4:
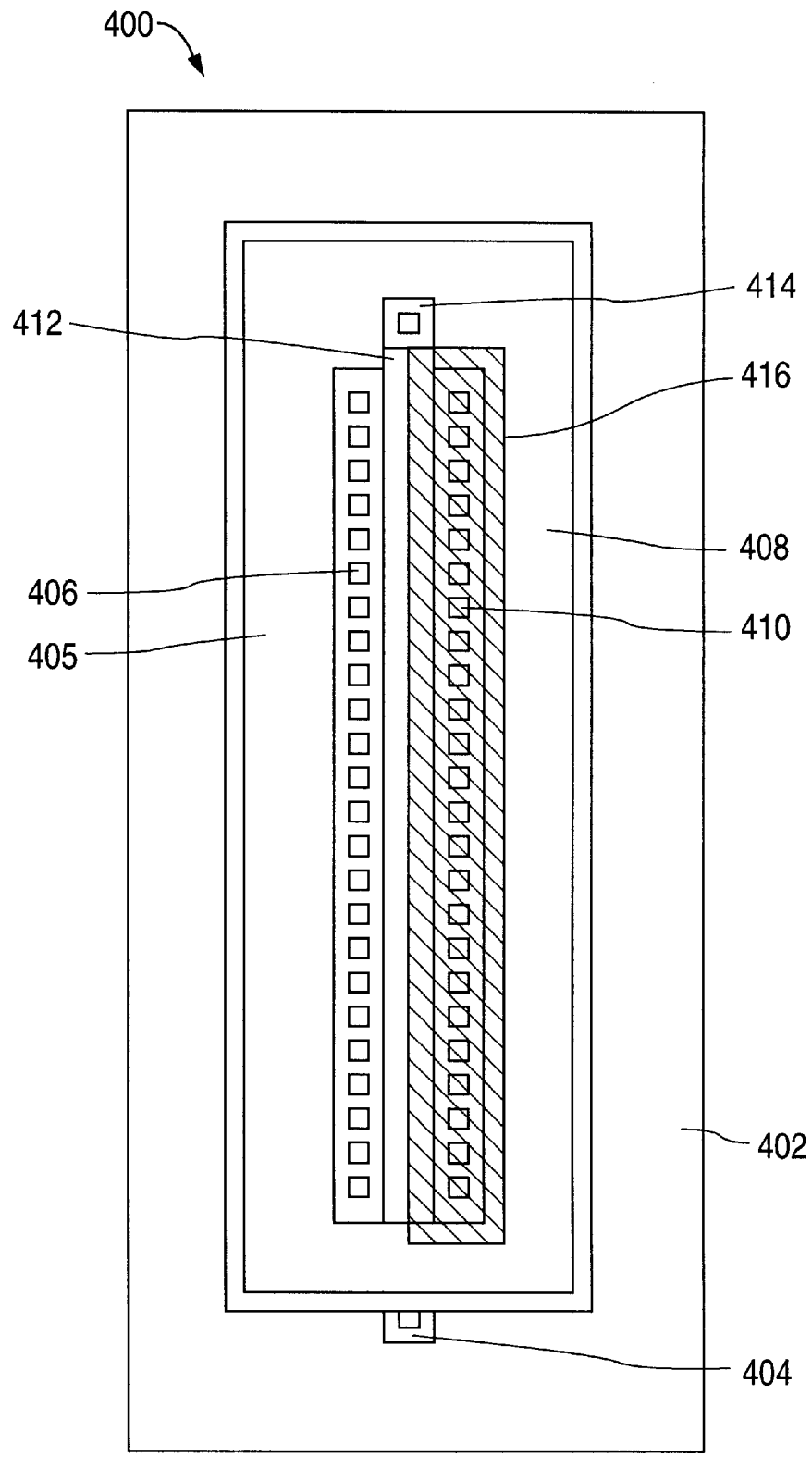
FIG. 4 shows a top view of a conceptual P-channel device in accordance with one embodiment of the present invention.

FIG. 4 shows a top view of a conceptual P-channel device 400 which requires an especially high voltage in order to operate. The high voltage requirements of P-channel device 400 increase the likelihood that the applied voltage will exceed the breakdown voltage, causing P-channel device 400 to fail.

P-channel device 400 includes substrate 402 having contact 404, source 405 having contact 406, drain 408 having contact 410, and gate 412 having contact 414. FIG. 4 also shows the orientation of P-field mask 416 used to create drain 408 of P-channel row decoder 400. Because P-field mask 416 is a clear mask, the p-field implant includes the edge regions of drain 408.

FIGS. 5A–5F illustrates the increase in drain-substrate breakdown voltage ($BV_{DSS}$) of P-channel devices having drains formed in accordance with the process of the current invention over P-channel devices having drains formed in the conventional manner.

FIG. 5A shows P-channel device 500 having a gate oxide thickness 135 Å. FIG. 5B shows that the $BV_{DSS}$ is increased from 11 V to 12 V.

FIG. 5C shows a P-channel device 502 that is the same as the P-channel device 500, except that the gate is grounded. FIG. 5D shows that the $BV_{DSS}$ is increased to 10.971 V to 11.800 V.

FIG. 5E shows a P-channel device 504 having a non-grounded gate with gate oxide thickness 360 Å. FIG. 5F shows an increase in $BV_{DSS}$ from 11.775 V to 13.200 V.

The processes and apparatuses in accordance with the present invention pose several important advantages. First, the present invention increases the breakdown voltage of P-channel devices without any increase in size. One alternative to the present invention would be to increase the distance between the device regions in order to inhibit the diversion of current into the substrate. However, rather than increasing device size, the present invention simply increases breakdown voltage by depleting the N type dopant concentration in highly specific regions.

The present invention poses a further advantage in that it may be implemented with no additional process steps. A second alternative to the present invention would be to create a special low concentration N-well for the P-channel devices. However, this alternatives would require additional masking and other process steps in order to create the area of low concentration. In the present invention, P type impurity is simply implanted into the N type substrate during the existing P-field implant step. This modification requires only a minor alteration in the shape of the existing P-field mask. Because no additional masking steps are needed, improved breakdown voltage can be obtained without any decline in fabrication process efficiency.

Finally, the specific process steps and structures described above represent only particular embodiments of the present invention. For example, the process in accordance with the present invention may also be used to implant P type impurity into silicon-silicon dioxide interface regions expected to be adjacent to the source, thereby increasing the source-substrate breakdown voltage.

Therefore, it is intended that the following claims define the scope of the invention, and that methods and structures within the scope of these claims and their equivalents be covered thereby.

What is claimed is:

1. A method for creating a P-channel MOS device comprising the steps of:

forming a silicon dioxide growth mask over first portions of N type silicon such that areas outside of the silicon dioxide growth mask are silicon dioxide growth regions;

forming a P-field mask over the N type silicon such that only a narrow portion of the N type silicon is not masked by the silicon dioxide growth mask and the P-field mask, the narrow portion occupying an area of the N type silicon expected to lie at the interface between the N-type silicon and silicon dioxide to be grown;

implanting P type dopant into the narrow portion;

removing the P-field mask;

forming silicon dioxide in the silicon dioxide growth regions such that N type dopant segregated during silicon dioxide growth accumulates in the narrow portion;

removing the silicon dioxide growth mask;

forming first and second spaced-apart regions of P type conductivity within the N-well to define a substrate channel region; and forming a conductive gate region over the channel region and separated therefrom by a dielectric material.

2. A method in accordance with claim 1 wherein the P type dopant comprises boron.

3. A method in accordance with claim 1 wherein the narrow portion occupies a region expected to lie at the silicon-silicon dioxide interface immediately adjacent to the spaced apart region of P type conductivity that functions as a drain.

4. A method in accordance with claim 1 wherein the narrow portion occupies a region expected to lie along the silicon-silicon dioxide interface immediately adjacent to the spaced apart region of P type conductivity that functions as a source.

* * * * *